(12) United States Patent
Chu et al.

(10) Patent No.: US 9,811,415 B2
(45) Date of Patent: Nov. 7, 2017

(54) APPARATUS AND METHOD FOR DETECTING AND CORRECTING READ DISTURB ERRORS ON A FLASH MEMORY

(71) Applicant: SYMBOL TECHNOLOGIES, INC., Lincolnshire, IL (US)

(72) Inventors: Shan Chu, Coram, NY (US); James R Fuccello, Patchogue, NY (US)

(73) Assignee: Symbol Technologies, LLC, Holtsville, NY (US)

( * ) Notice: Subject to any disclaimer, the term of this patent is extended or adjusted under 35 U.S.C. 154(b) by 99 days.

(21) Appl. No.: 14/638,431

(22) Filed: Mar. 4, 2015

(65) Prior Publication Data
US 2015/0278014 A1 Oct. 1, 2015

Related U.S. Application Data

(60) Provisional application No. 61/972,802, filed on Mar. 31, 2014.

(51) Int. Cl.
| | | |
|---|---|---|
| G11C 29/00 | (2006.01) | |
| G06F 11/10 | (2006.01) | |
| G11C 29/52 | (2006.01) | |

(52) U.S. Cl.
CPC ........ *G06F 11/1068* (2013.01); *G06F 11/106* (2013.01); *G06F 11/1052* (2013.01); *G11C 29/52* (2013.01)

(58) Field of Classification Search
CPC ............... G06F 11/1068; G06F 11/106; G06F 11/1052; G11C 29/52
See application file for complete search history.

(56) References Cited

U.S. PATENT DOCUMENTS

| | | | | |
|---|---|---|---|---|
| 2004/0243912 A1* | 12/2004 | Larsen | ................... | G11B 20/18 714/770 |
| 2005/0060603 A1* | 3/2005 | Pomaranski | .......... | G06F 11/106 714/6.32 |
| 2006/0039196 A1* | 2/2006 | Gorobets | .............. | G06F 11/106 365/185.01 |
| 2008/0046778 A1* | 2/2008 | Yoshida | .............. | G06F 11/1068 714/5.1 |
| 2009/0044061 A1* | 2/2009 | Visconti | .............. | G06F 11/1072 714/718 |

(Continued)

OTHER PUBLICATIONS

International Search Report and Written Opinion dated Jun. 22, 2015 in counterpart PCT application PCT/2015/021977.

*Primary Examiner* — Guy Lamarre

(57) ABSTRACT

An application executed on a device reads a portion of a memory during one of an initialization operation and a regular read operation. The application may trigger a preventative read operation during at least one regular read operation. During the preventative read operation the application selects at least one block and at least one page for the preventative read operation. The application determines a cadence for the preventative read operation. The application obtains an error correction code (ECC) status for the portion of the memory, determines if a number of errors associated with the portion is greater than a predefined ECC threshold and performs a correction, responsive to determining that a number of errors associated with the portion is greater than a predefined ECC threshold.

2 Claims, 5 Drawing Sheets

(56) References Cited

U.S. PATENT DOCUMENTS

| | | | |
|---|---|---|---|
| 2009/0070647 A1* | 3/2009 | Allison | G06F 11/106 714/746 |
| 2009/0319825 A1 | 12/2009 | Yang et al. | |
| 2010/0231535 A1* | 9/2010 | Chaudhri | G06F 3/0481 345/173 |
| 2010/0332894 A1* | 12/2010 | Bowers | G06F 11/1008 714/6.13 |
| 2013/0067266 A1* | 3/2013 | Gearing | G06F 11/008 714/4.1 |
| 2014/0063955 A1 | 3/2014 | Kawase et al. | |

\* cited by examiner

APPARATUS AND METHOD FOR DETECTING AND CORRECTING READ DISTURB ERRORS ON A FLASH MEMORY

BACKGROUND OF THE INVENTION

Flash memory is an electronic non-volatile computer storage medium that can be electrically erased and reprogrammed. One type of flash memory, a Negated AND or NOT AND (NAND), allows information stored on portions of the NAND to be rewritten rather than requiring the entire memory to be erase before information can be rewritten. Accordingly, the NAND flash memory is widely used in electronic devices. For example, NAND flash memory is used in the main memory of electronic devices, in memory cards, Universal Serial Bus (USB) flash drives and solid-state drives.

The NAND flash memory is organized into blocks, each of which includes a number of pages. A few bytes in each page may be used to store an error correction code (ECC) checksum. The memory cells are coupled together in series from top to bottom (i.e., in a column) to form a bit line and from left to right (i.e., in a row) to form a word line. Reading and programming portions of the NAND flash memory may be performed on a page basis and erasure may only be performed on a block basis. A control gate in each memory cell is used to control the reading, programming and erasing of the cell by applying different control voltages. When a page is being read, four voltage levels are applied to the block which includes the page that is being read. A voltage level is applied to the top portion of each bit line in the block, a voltage level applied to the bottom of each bit line, a voltage level is applied to the control gates of all cells in the pages in the block that are not being read, and a voltage level is applied to the control gates of cells in the page that is being read.

Cells in pages in a block that are not being read may become stress cells. Consider for example that a block has 1-N pages. When cells on a second page are being read, due to the way voltages are applied to the other pages, cells on those pages may receive elevated voltage and become stress cells (i.e. the cell appears to be weakly programmed). Stress cells may be vulnerable to a read disturb error. A read disturb error is a condition that occurs when a given area of memory is read excessively, causing the data in that area of the memory to be changed from its original values and thus altering the contents of, for example, applications, operating systems or data, stored in that area of the memory. This is not a permanent condition and when detected early, the read disturb error may be corrected by re-writing the contents of the affected areas with read disturb error(s) to another area in the memory.

The NAND flash memory uses the ECC to correct bits in the memory that fail during normal device operations. When an ECC feature is enabled, the ECC is generated internally when a page is written to a memory core. Thereafter, when the page is read to a cache register, the ECC is calculated again and compared with the ECC value stored in the memory core and bit errors are corrected, if necessary. A device accessing the NAND flash memory either outputs the corrected data or returns an ECC status. However, there is limit on the number of bit errors within a page that the ECC can be used to correct. For example, in one device, the ECC may be used to correct up to four bit errors within a page. Hence, as the read count of a block increases, more read disturb error bits may appear in the block, wherein the number of read disturb error bits could eventually exceed the error correction capability of the ECC. When the error correction capability of the ECC is exceeded, the information in a block may become corrupted, and could potentially become unreadable or unreliable before the read disturb error is corrected. Given the wide use of the NAND flash memory, it is desirable to detect and correct read disturb errors before such errors lead to failure of the NAND flash memory.

Accordingly, there is a need for apparatus and method for detecting and correcting read disturb errors on a flash memory.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
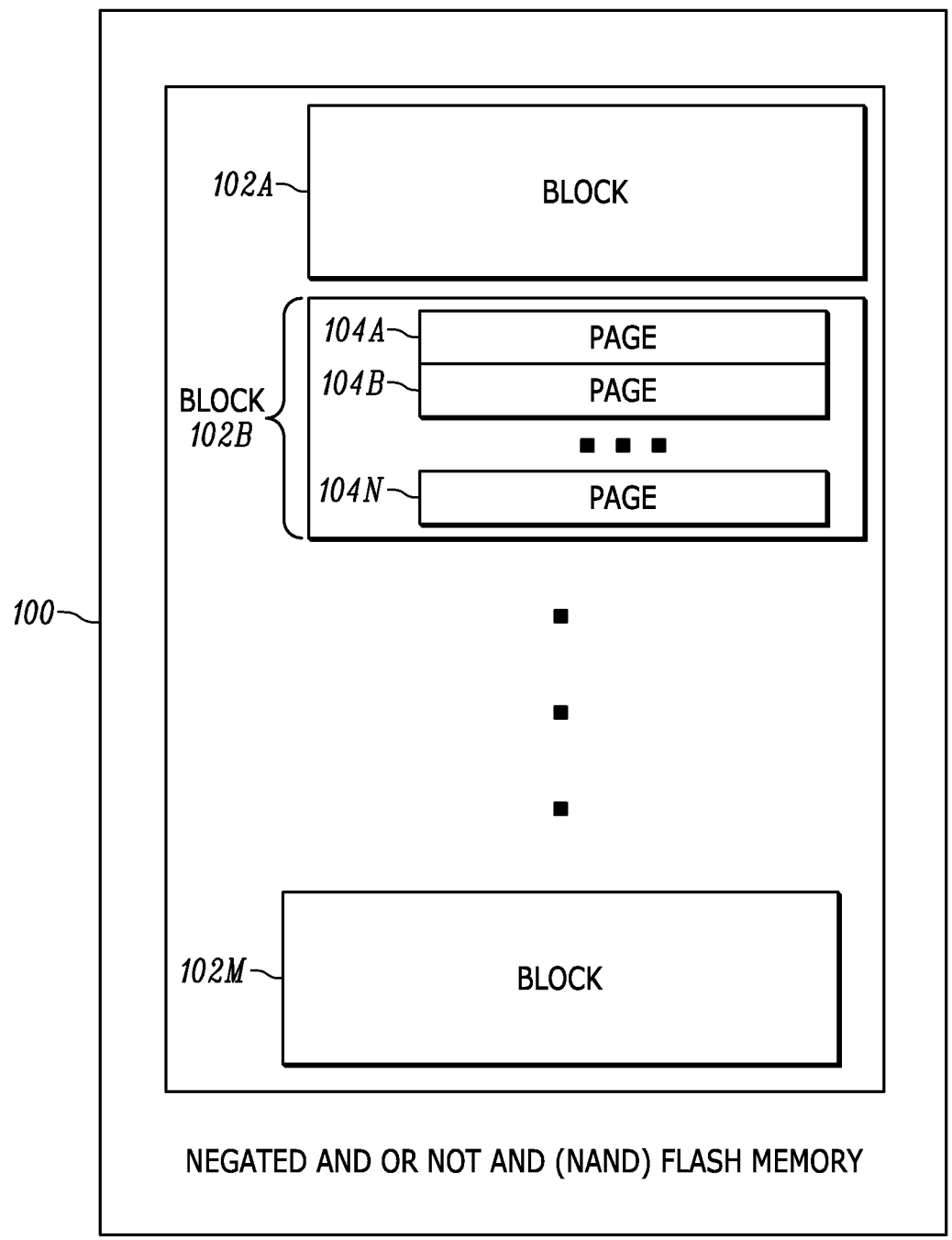
FIG. 1 is a block diagram of a Negated AND or NOT AND (NAND) flash memory used in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Some embodiments are directed to apparatuses and methods wherein an application executed on a device reads a portion of a memory during one of an initialization operation and a regular read operation. The application determines a cadence for the preventative read operation. The application may trigger a preventative read operation during at least one regular read operation. During the preventative read operation the application selects at least one block and at least one page for the preventative read operation. The application obtains an error correction code (ECC) status for the portion of the memory, determines if a number of errors associated with the portion is greater than a predefined ECC threshold and performs a correction, responsive to determining that a number of errors associated with the portion is greater than a predefined ECC threshold.

FIG. 1 is a block diagram of a Negated AND or NOT AND (NAND) flash memory that is operated on in accordance with some embodiments. NAND flash memory 100 (also referred to herein as NAND 100) includes one or more blocks 102 (i.e., blocks 102a-102m), each of which includes one or more pages 104 (i.e., pages 104a-104n). One or more bytes (not shown) in each page 104 may be used to store an error correction code (ECC). NAND flash memory may be used, for example, in the memory of electronic devices, in memory cards, USB flash drives, solid-state drives, or an equivalent. A device accessing NAND 100 may include an application/processor (not shown) that is configured to detect, subsequent to accessing NAND 100, a pre-read disturb state on NAND 100. It should be noted that NAND 100 may be accessed by an application/processor (referred to herein simply as an application) within a device that is physically separated from NAND 100 or NAND 100 may be accessed by an application within the same physical device as NAND 100. Hence, reference herein to the application incorporates applications within a device that is physically separated from NAND 100 (i.e. NAND may be externally coupled to the device) and applications within the same device as NAND 100.

In accessing NAND 100, the application may read pages from NAND 100 and may obtain an ECC status for each page during a read operation. The read operations may occur during initialization of NAND 100 or during initialization of the device accessing NAND 100, during a regular read operation (i.e., a read operation in which at least one page on NAND 100 is read based on execution of a process/activity on the device), or during a preventative read operation (i.e., a read operation trigger by a regular read operation). The preventive read operation is an additional read operation of designated pages in designated blocks in NAND 100. The preventive read operation is carried out in addition to the regular read operation to detect a pre-read disturb state on NAND 100 and correct the area(s) of NAND 100 with the pre-read disturb state before a failure occurs the detected area(s).

Figure 2:
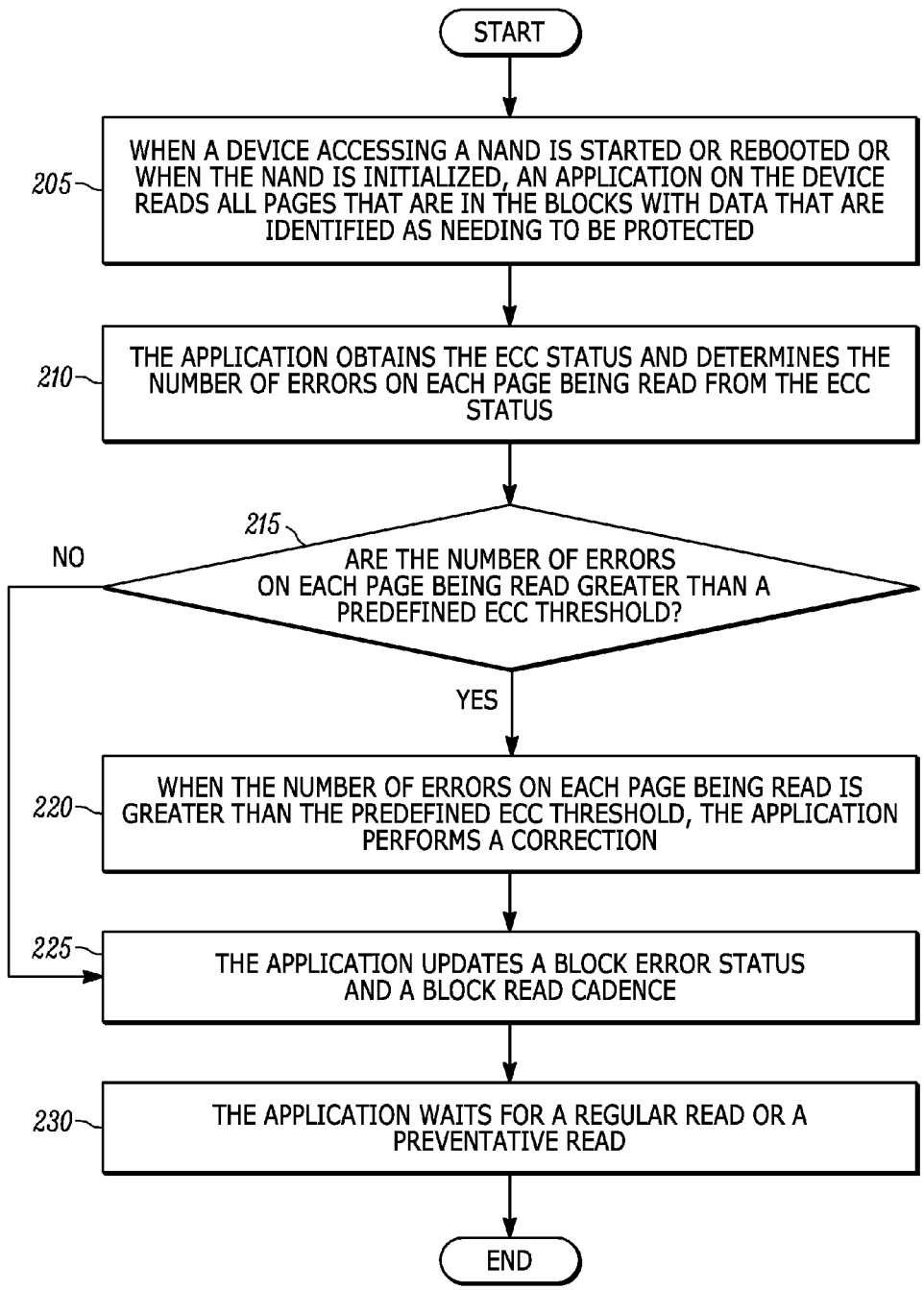
FIG. 2 illustrates a flow diagram of a method for detecting a pre-read disturb state on a NAND flash memory during an initialization operation in accordance with some embodiments.

FIG. 2 illustrates a flow diagram of a method for detecting a pre-read disturb state on a NAND flash memory during an initialization in accordance with some embodiments. At 205, when a device accessing NAND 100 is started or rebooted or when NAND 100 is initialized, an application on the device reads all pages that are in the blocks with data that are identified as needing to be protected. At 210, the application obtains the ECC status and determines the number of errors on each page being read from the ECC status.

At 215, the application determines if the number of errors on each page being read is greater than a predefined ECC threshold. The predefined ECC threshold may be a preset threshold or it may be a threshold that is based on a previous status. For example, the preset threshold may be a preset constant value, such as a limit (N) associated with a maximum number of correctable errors on each page. Alternatively, the predefined ECC threshold may be based on an incremental error rate. Consider for example that the application may have to keep track of the previous error status of each page. The application may determine that the number of errors on each page has not reached the predefined ECC threshold the first time the ECC status reaches the limit minus a value (for example, N−2), and that the number of errors on each page has reached the predefined ECC threshold the first time the ECC status flips between N−2 and N−1. The reason for this is that a cell in partial programmed status can flip between 1 and 0 which also causes the ECC status to flip.

At 220, when the number of errors on each page being read is greater than the predefined ECC threshold, the application performs a correction. At 225, when the number of errors on each page being read is less than the predefined ECC threshold, the application updates a block error status and a block read cadence. The cadence is how frequently, or rate, a preventative read operation should be performed. For example, the cadence for a specific page could be perform one preventative read to this page for every 1000 regular read operations to this page. At 230, the application waits for a regular read, as shown in FIG. 3 or a preventative read, as shown in FIG. 4.

Figure 3:
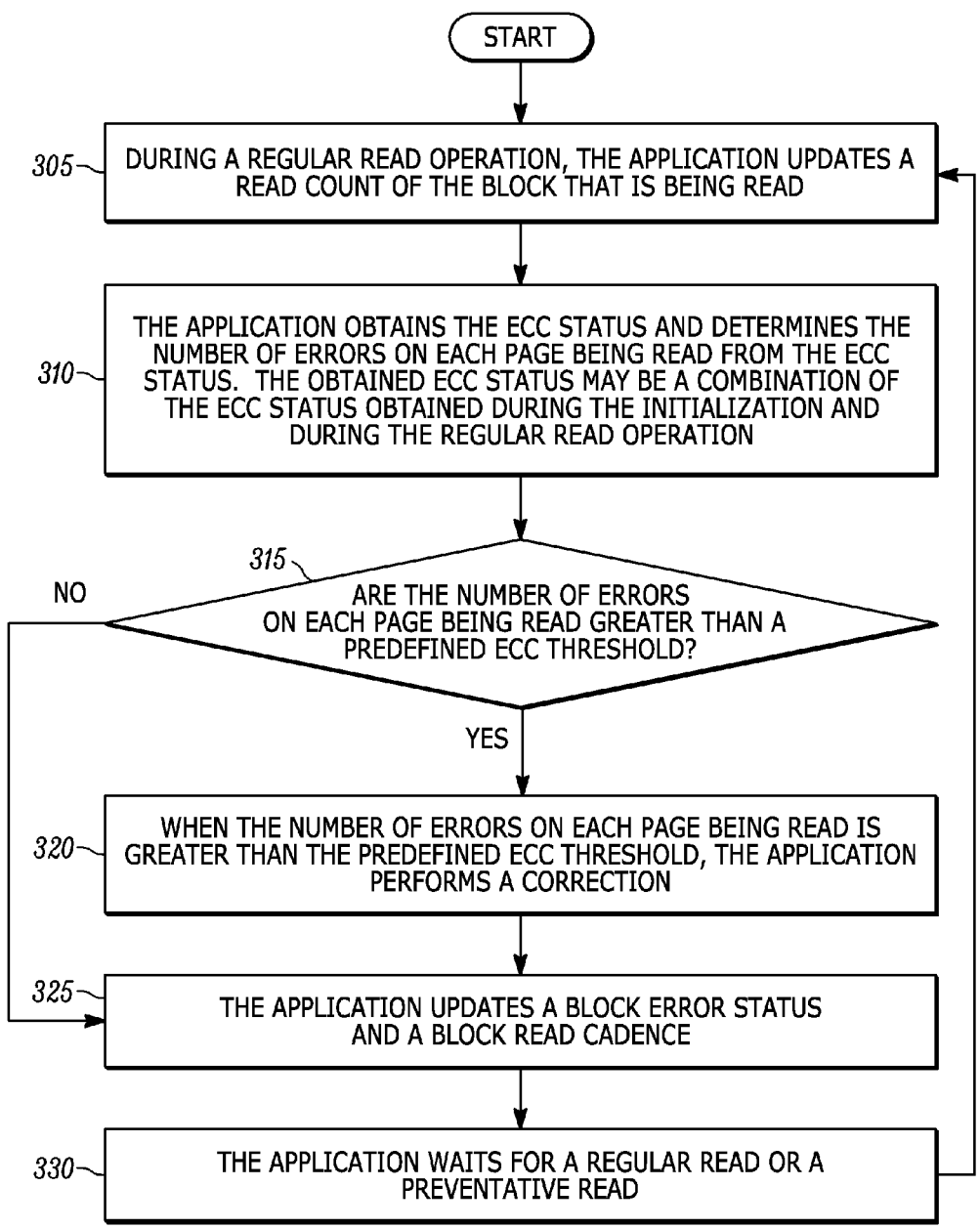
FIG. 3 illustrates a flow diagram of a method for detecting a pre-read disturb state on a NAND flash memory during a regular read operation in accordance with some embodiments.

FIG. 3 illustrates a flow diagram of a method for detecting a pre-read disturb state on a NAND flash memory during a regular read operation in accordance with some embodiments. At 305, during a regular read operation, the application updates a read count of the block that is being read. At 310, the application obtains the ECC status and determines the number of errors on each page being read from the ECC status. The obtained ECC status may be a combination of the ECC status obtained during the initialization and during the regular read operation. At 315, the application determines, based on the ECC status, if the number of errors on each page being read is greater than a predefined ECC threshold. At 320, when the number of errors on each page being read is greater than the predefined ECC threshold, the application performs a correction. At 325, when number of errors on each page being read is less than the predefined ECC threshold, the application updates the block error status and the block read cadence. At 330, the application waits for another regular read operation.

Figure 4:
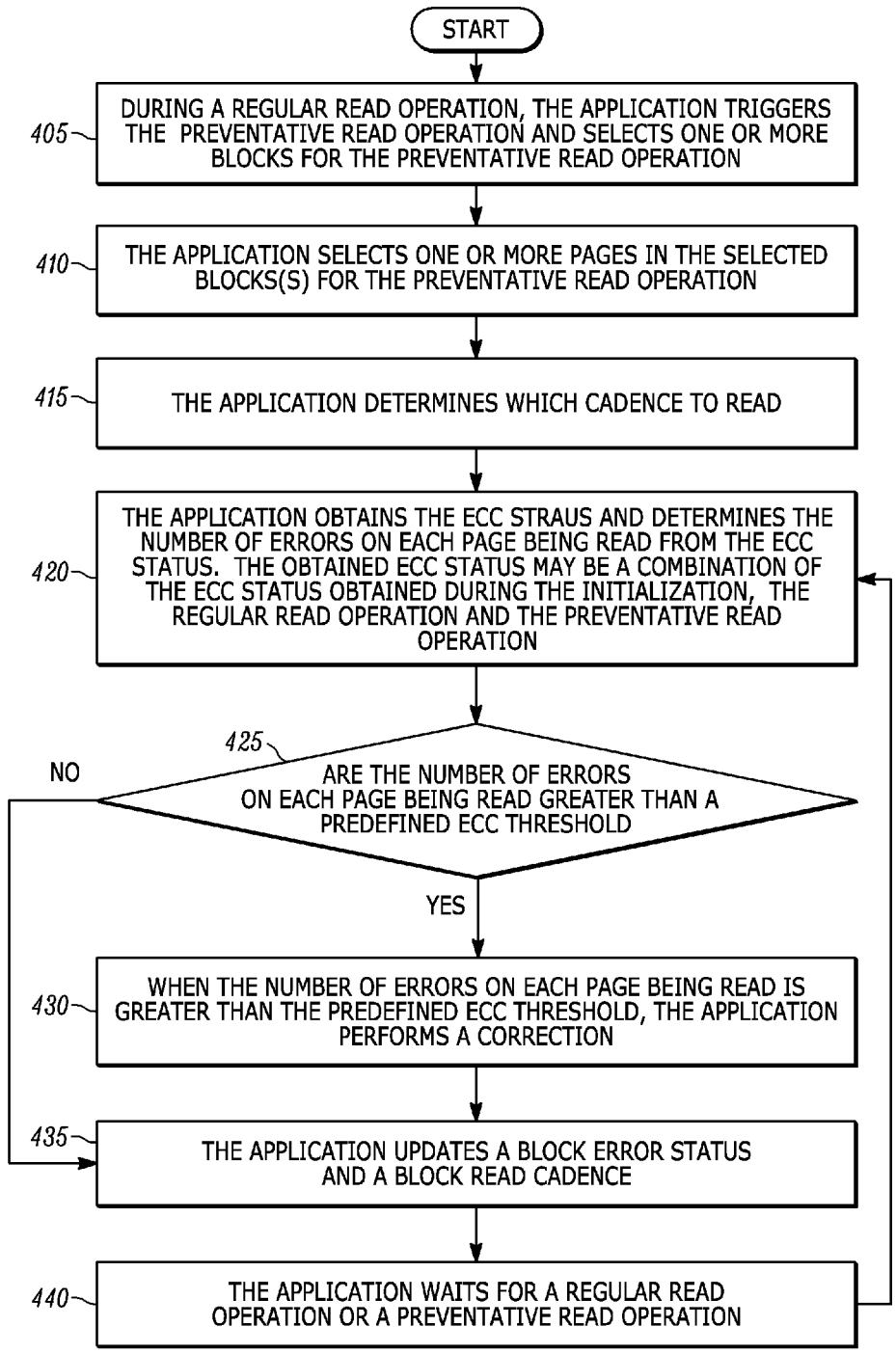
FIG. 4 illustrates a flow diagram of a method for detecting a pre-read disturb state on a NAND flash memory during a preventative read operation in accordance with some embodiments.

FIG. 4 illustrates a flow diagram of a method for detecting a pre-read disturb state on a NAND flash memory during a preventative read operation in accordance with some embodiments. At 405, during a regular read operation, the application triggers the preventative read operation and selects one or more blocks for the preventative read operation. The application may select one or more of at least one block with a page that has been read since a previous erase operation, at least one block with data that is predetermined to be important, and at least one block with an indication of a read disturb error. In order to select a block with a page that that has been read since a previous erase operation, the application may keep track of when a page in each block is read. In order to identify a block with data that is predetermined to be important, the application may keep a list of blocks identified to have important information, for example, blocks storing information for an operating system. Other examples of information that would be considered important include blocks storing critical applications, blocks storing critical user data, and the like. What information is considered as important is defined by the user and can be configured. The application may identify an indication of a read disturb error if an error is indicated in the ECC status from a previous read operation.

At 410, the application selects one or more pages in the selected block(s) for the preventative read operation. The application may select one or more of at least one unread page in the selected block, all pages in the selected block, random pages in the selected block, pages with a sign of a read disturb error in the selected block, and pages meeting at one predefined page selection criterion. While during a regular read operation the application can detect error(s) on pages being read, it is possible that a page that is not read during a regular read operation may also have errors that would not be identified by the regular read operation. Therefore, the application may keep track of when a page is read and may select one or more unread pages in the selected block for the preventative read operation.

In selecting a page with a sign of a read disturb error, the application may also select a page with an error, as indicated by the ECC status from a previous read operation. The at least one page selection criterion used in selecting a page may include selecting a page with the top highest number (P) of errors in the block. To prevent a read disturb error, a practical correction may be to rewrite a block when any page in the block is close to having an uncorrectable error (for example, having a number of errors greater than a limit that can be corrected the ECC). Therefore, the application may select pages with the P highest numbers of errors in the block for the preventative read operation. By performing preventative read on the pages with the P highest number of errors, the application may reduce the overhead associated with the preventative read operations. To ensure that the pages with the P highest number of errors are always accurately captured, an all-page-read may be triggered for every M preventative read of a block. For example, this may be done by generating a random number and comparing the random number to a probability of 1/M, wherein for the other M−1 preventative read operations, only the previously identified pages with the P highest number of errors may be read and monitored.

At 415, the application determines which cadence to read. The cadence may be a saved empirical value or another value determined by the application. A higher cadence increases the activity of the application and may impact system performance while a lower cadence may increase the risk of the application failing to detect a read disturb error before a failure occurs. For example, a higher cadence may consume more battery power. To determine which cadence to read, the application may select one or more of a preset cadence, a cadence that is incremented based on the read count, a cadence that is varied based on the ECC status, a cadence that a varied across blocks or memory partitions, and a cadence that is varied across pages in a block. In selecting a cadence that is preset, the application may perform preventative read operations on all blocks at any time.

In selecting a cadence that is incremented based on the read count consideration is given to the assumption that as the number of read operations on a block increases, the possibility that an error may occur also increases. The application may therefore track the number of read operations performed on each block since a pervious erase operation and increase the cadence with each read operation.

In selecting a cadence that is varied based on the ECC status, consideration is given to the assumption that as the number of errors increases, the possibility that a failure might occur in the block also increases, and therefore closer monitoring of the block is required. In general, the cadence should increases with higher number of bit errors, as indicated by the ECC status. The application may therefore determine the cadence based on the current ECC status.

In selecting a cadence that is varied across blocks or memory partitions, consideration is given to the assumption that as the accumulation rate of bit errors varies across blocks, the application can determine varied cadences at the block level or the memory partition level. For example, the application may determine that a preventative read operation should be performed sooner in a block that currently has a higher number of bit errors than in a block that currently has a lower number of bit errors. In another example, a partition in the memory with, for example, operation system information that is read more frequently and is thus more prone to having a read disturb error should have a higher cadence for preventative read operations than a partition in the memory with application information that is read less frequently.

In selecting a cadence that is varied across pages in a block, consideration is given to the assumption that as the accumulation rate of bit errors varies across pages within a block, the application can determine varied cadences at the page level. For example, the application may determine that the cadence for pages that currently have a higher number of bit errors is same as the cadence for the block and the cadence for pages that currently have a lower number of bit errors can be a fraction of the cadence for the block.

At 420, the application obtains the ECC status and determines the number of errors on each page being read from the ECC status. The obtained ECC status may be a combination of the ECC status obtained during the initialization, the regular read operation and the preventative read operation. At 425, the application determines, based on the ECC status, if the number of errors on each page being read is greater than a predefined ECC threshold. At 430, when the number of errors on each page being read is greater than the predefined ECC threshold, the application performs a correction. At 435, when number of errors on each page being read is less than the predefined ECC threshold, the application updates the block error status and the block read cadence. At 440, the application waits for another read operation.

Figure 5:
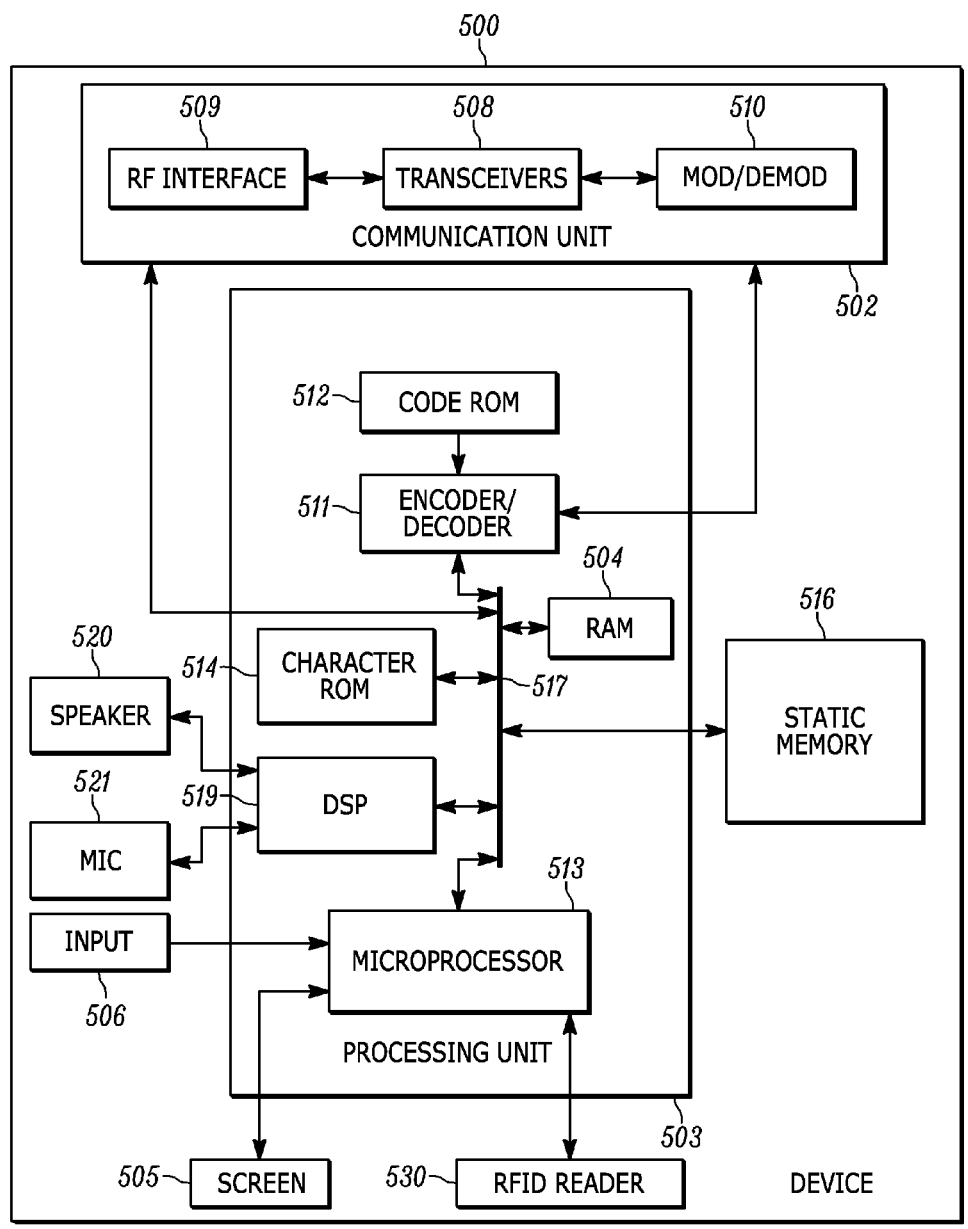
FIG. 5 is a block diagram of a device used in accordance with some embodiments.

FIG. 5 is a block diagram of a device used in accordance with some embodiments. Device 500 includes a communications unit 502 coupled to a common data and address bus 517 of a processing unit 503. Device 500 may also include one or more peripherals, for example, a radio frequency identifier (RFID) reader 230 configured to scan RFID tags or badges. Device 500 may also include an input unit (e.g., keypad, pointing device, etc.) 506, an output transducer unit (e.g., speaker) 520, an input transducer unit (e.g., a microphone) (MIC) 521, and a display screen 505, each coupled to be in communication with the processing unit 503.

Processing unit 503 may include an encoder/decoder 511 with an associated code read only memory (ROM) 512 for storing data for encoding and decoding voice, data, control, or other signals that may be transmitted or received by device 500. Processing unit 503 may further include a microprocessor 513 coupled, by the common data and address bus 517, to the encoder/decoder 511, a character ROM 514, a random-access memory (RAM) 504, and a static memory 516. One or more of the memory on device 500 may be a NAND. The processing unit 503 may also include a digital signal processor (DSP) 519, coupled to the speaker 520, the microphone 521, and the common data and address bus 517, for operating on audio signals received from one or more of the recording device 232, the communications unit 502, the static memory 516, and the microphone 521.

Communications unit 502 may also include a wired network connection. Communications unit 502 may also include an (radio frequency) RF interface 509 configurable to communicate with network components, and other user equipment within its communication range. Communications unit 502 may include one or more broadband and/or narrowband transceivers 508, such as an Long Term Evolution (LTE) transceiver, a Third Generation (3G) (3GGP or 3GGP2) transceiver, an Association of Public Safety Communication Officials (APCO) Project 25 (P25) transceiver, a Digital Mobile Radio (DMR) transceiver, a Terrestrial Trunked Radio (TETRA) transceiver, a WiMAX transceiver perhaps operating in accordance with an IEEE 802.16 standard, and/or other similar type of wireless transceiver configurable to communicate via a wireless network for infrastructure communications.

Communications unit 502 may also include one or more local area network or personal area network transceivers such as wireless local area network transceiver perhaps operating in accordance with an IEEE 802.11 standard (e.g., 802.11a, 802.11b, 802.11g), or a Bluetooth transceiver. For any IEEE standards recited herein, contact the IEEE at IEEE, 445 Hoes Lane, PO Box 1331, Piscataway, N.J. 08855-1331, USA. The transceivers may be coupled to a combined modulator/demodulator 510 that is coupled to the encoder/decoder 511.

The character ROM 514 may store code for decoding or encoding data such as control, request, or instruction messages, channel change messages, and/or data or voice messages that may be transmitted or received by device 500. Static memory 516 may store the application(s) for accessing a NAND and for performing one or more of the steps set forth in FIGS. 2-4.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A method of detecting a pre-read disturb state on a flash memory, the flash memory including a plurality of blocks each having a plurality of pages, the method comprising the steps of:
 for each of the plurality of blocks, determining a preventative read operation cadence based at least in part on the respective block having a predetermined level of importance, the predetermined level of importance corresponding to operating system data, critical application data, and critical user data;
 during an initialization operation, for each of the plurality of blocks:

reading each of the plurality of pages;
determining a first ECC status for each of the plurality of pages;
determining a first number of errors for each of the plurality of pages based at least in part on the respective first ECC status;
performing a correction responsive to determining that the first number of errors is greater than a predefined first ECC threshold; and
updating a block error status and a block read cadence;
conducting a regular read operation, for each of the plurality of blocks being read during the regular read operation, the regular read operation including the sub-steps of:
updating a read count;
determining a second ECC status for each of the plurality of pages;
determining a second number of errors for each of the plurality of pages based at least in part on the respective second ECC status;
performing the correction responsive to determining that the second number of errors is greater than a predefined second ECC threshold;
updating the block error status and the block read cadence, and
for at least one of the plurality of blocks being read during the regular read operation, triggering the preventative read operation based in part on the block read cadence and further based in part on the preventative read operation cadence, the preventative read operation being executed on each of the pages within the each of the at least one of the plurality of blocks being read during the preventative read operation.

2. The method of claim 1, wherein the preventative read operation is performed at a frequency, the frequency being based on at least one of a preset frequency, the read count, and at least one of the first and second ECC status, wherein the frequency of the preventative read operation is varied between at least two of the pages within the each of the at least one of the plurality of blocks being read during the preventative read operation.

* * * * *